United States Patent [19]
Wojnarowski et al.

[11] Patent Number: 5,562,838
[45] Date of Patent: Oct. 8, 1996

[54] OPTICAL LIGHT PIPE AND MICROWAVE WAVEGUIDE INTERCONNECTS IN MULTICHIP MODULES FORMED USING ADAPTIVE LITHOGRAPHY

[75] Inventors: Robert J. Wojnarowski, Ballston Lake; Herbert S. Cole, Scotia; John L. Henkes, Latham, all of N.Y.

[73] Assignee: Martin Marietta Corporation, Bethesda, Md.

[21] Appl. No.: 37,833

[22] Filed: Mar. 29, 1993

[51] Int. Cl.⁶ .................................................. G02B 6/00
[52] U.S. Cl. .............................. 216/24; 216/33; 216/39; 385/14; 385/132
[58] Field of Search .......................... 216/24; 385/129, 385/132, 14, 49, 5

[56] References Cited

U.S. PATENT DOCUMENTS

| | | | |
|---|---|---|---|
| 3,641,332 | 2/1972 | Reick et al. | 385/142 |
| 4,883,743 | 11/1989 | Booth et al. | 430/321 |
| 5,061,020 | 10/1991 | Ishikawa | 385/132 |
| 5,170,448 | 12/1992 | Ackley et al. | 385/31 |
| 5,317,082 | 5/1994 | Beuhler et al. | 385/123 X |

FOREIGN PATENT DOCUMENTS 87105  3/1990  Japan ...................... 385/129

OTHER PUBLICATIONS

B. L. Booth, "Low Loss Channel Waveguides in Polymers", Journal of Lightwave Technology, vol. 7, No. 10, Oct., 1989, pp. 1445–1453.

R. Selvaraj et al., "Integrated Optical Waveguides in Polyimide for Wafer Scale Integration", Journal of Lightwave Technology, vol. 6, No. 6, Jun., 1988, pp. 1034–1044.

Primary Examiner—Thi Dang
Attorney, Agent, or Firm—Brian J. Rees; Geoffrey H. Krauss

[57] ABSTRACT

HDI fabrication techniques are employed to form a variety of optical waveguide structures in polymer materials. Adaptive optical connections are formed, taking into account the actual position and orientation of devices which may deviate from the ideal. Structures include solid light-conducting structures, hollow light-conducting structures which are also suitable for conducting cooling fluid, and optical switching devices employing liquid crystal material. A "shrink back" method may be used to form a tunnel in polymer material which is then filled with an uncured polymer material that shrinks upon curing.

12 Claims, 11 Drawing Sheets

OPTICAL LIGHT PIPE AND MICROWAVE WAVEGUIDE INTERCONNECTS IN MULTICHIP MODULES FORMED USING ADAPTIVE LITHOGRAPHY

BACKGROUND OF THE INVENTION

This invention relates generally to optical waveguides in polymer materials and, more particularly, to optical waveguides formed employing fabrication techniques compatible with high density interconnect (HDI) fabrication techniques, including the use of adaptive lithography to compensate for component misposition.

As disclosed in commonly assigned Eichelberger et al. U.S. Pat. No. 4,783,695, and related patents such as those referenced hereinbelow, a high density interconnect structure offers many advantages in the compact assembly of electronic systems. For example, a microcomputer which incorporates between thirty and fifty chips, or even more, can be fully assembled and interconnected on a single substrate which is two inches long by two inches wide by 50 mils thick. This structure is referred to herein as an "HDI structure", and the various previously-disclosed methods for fabricating HDI structures are referred to herein as "HDI fabrication techniques".

Very briefly, in systems employing this high density interconnect structure, a ceramic substrate is provided, and individual cavities, or one large cavity having appropriate depths at the intended locations of the various chips, are prepared. Various components are placed in their desired locations within the appropriate cavity and adhered to the substrate by means of a thermoplastic adhesive layer.

A multi-layer high density interconnect (HDI) overcoat structure is then built up to electrically interconnect the components into an actual functioning system. To begin the HDI overcoat structure, a polyimide dielectric film, such as KAPTON® polyimide available from E.I. du Pont de Nemours & Company, about 0.0005 to 0.003 inch (12.5 to 75 microns) thick is pretreated to promote adhesion and coated on one side with ULTEM® polyetherimide resin available from General Electric Company, or another thermoplastic, and laminated across the tops of the chips, other components and the substrate, with the Ultem resin serving as a thermoplastic adhesive to hold the Kapton film in place. (KAPTON is a trademark of E.I. dupont de Nemours & Co., and ULTEM is a trademark of General Electric Company.) Exemplary lamination techniques are disclosed in commonly assigned Eichelberger et al. U.S. Pat. No. 4,933,042.

The actual as-placed locations of the various components and contact pads thereon are typically determined by employing optical imaging techniques. Via holes are adaptively laser drilled in the Kapton film and Ultem adhesive layers in alignment with the contact pads on the electronic components in their actual as-placed positions. Exemplary laser drilling techniques are disclosed in commonly assigned Eichelberger et al. U.S. Pat. Nos. 4,714,516 and 4,894,115, and Loughran et al. U.S. Pat. No. 4,764,485.

A metallization layer is deposited over the KAPTON film layer and extends into the via holes to make electrical contact to the contact pads disposed thereunder. This metallization layer may be patterned to form individual conductors during its deposition, or may be deposited as a continuous layer and then patterned using photoresist and etching techniques. The photoresist is preferably exposed using a laser which, under program control, is scanned relative to the substrate to provide an accurately aligned conductor pattern upon completion of the process. Exemplary techniques for patterning the metallization layer are disclosed in commonly assigned Wojnarowski et al. U.S. Pat. Nos. 4,780,177 and 4,842,677, and Eichelberger et al. U.S. Pat. No. 4,835,704 which concerns an "Adaptive Lithography System to Provide High Density Interconnect". Any misposition of the individual electronic components and their contact pads is compensated for by an adaptive laser lithography system as disclosed in U. S. Pat. No. 4,835,704.

As an alternative to electrical interconnections, various forms of waveguide structures in optically transparent dielectrics such as polyimides have been proposed. Examples are disclosed in the literature and include R. Selvaraj, H.T. Lin and J.F. McDonald, "Integrated Optical Waveguides in Polyimide for Wafer Scale Integration," Journal of Lightwave Technology, Vol. 6, No. 6, June 1988, pages 1034–1044; and B.L. Booth, "Low Loss Channel-Waveguides in Polymers," Journal of Lightwave Technology, Vol. 7, No. 10, October 1989, pages 1445–1453. Related techniques are disclosed in Booth et al. U.S. Pat. No. 4,883,743.

SUMMARY OF THE INVENTION

One object of the invention is to merge HDI technology and optical waveguide technology, particularly through the use of adaptive lithography techniques, to produce optical interconnects.

A related object of the invention is to adapt HDI fabrication processes to a variety of microchannel waveguide structures.

Another object of the invention is to facilitate connections to fiber optic cables, including connections between fiber optic cables and electro-optical devices, and connections between fiber optic cables.

Another object of the invention is to adapt HDI fabrication processes to the manufacture of optical switches.

In accordance with an overall aspect of the invention, it is recognized that various well-developed HDI fabrication processes, including adaptive lithography, are adaptable to the formation of waveguide structures in polymers. Thus, a laser may be employed to mill away polymer materials such as KAPTON polyimide, ULTEM polyetherimide and the like to form micro-channel light pipes and/or optical waveguides which are integral to a multi-chip module. The laser milling process may be employed either as a positive or a negative imaging technique. Thus the desired channel profile may be formed below the polymer surface, or above. In general, the laser is used to directly ablate a controlled depth pattern of channels and canals, with laser power and profile being controlled in order to vary the channel depth, as previously done in the context of HDI fabrication processes.

In accordance with a more particular aspect, the invention provides an adaptive method for making an optical connection to a device on a substrate, where the device is not necessarily at a predetermined ideal position and orientation on the substrate. The method, for example, may comprise making an optical connection between an external waveguide and the device, between two devices, between a base waveguide at a predetermined location and a device, or making an optical connection to an electro-optical device which has an electrical connection comprising a high density interconnect structure.

The method comprises the steps of determining the actual position and orientation of the device on the substrate, and then adaptively forming an optical waveguide optically coupled to the device. The optical waveguide is formed along a route adapted as required for a proper optical coupling to the device in its actual position and orientation. In one form, the step of adaptively forming an optical waveguide includes the substeps of at least partially embedding the device in a layer of optical waveguide material, and then removing portions of the layer of optical waveguide material, such as by laser ablation, to leave the optical waveguide.

Alternatively, an electro-optical device may be integrated within a high density interconnect electronic module fabricated generally as described in the above-identified patents. In accordance with this aspect, a portion of the multilayer interconnect structure is removed, such as by laser ablation, to form a cavity opening therein. An electro-optical device is then placed within the cavity opening and situated within predetermined tolerances from an optimal or ideal position and orientation. The actual position and orientation of the electro-optical device is determined, and an optical waveguide optically coupled to the electro-optical device is then adaptively formed. The optical waveguide is formed along a route adapted as required for a proper optical coupling to the electro-optical device in its actual position and orientation, by at least partially embedding the device in a layer of optical waveguide material, and removing portions of the layer of optic waveguide material to leave the optical waveguide.

In accordance with another aspect of the invention, a fiber optic lightguide is fabricated by first providing a body of polymer material, for example a polyimide, and then forming a groove in the polymer surface. Preferably, the groove is formed by laser ablation, and adaptively positioned. Next, a liner is formed in the groove, the liner being of a polymer material having a relatively lower index of refraction. By way of example, the liner may comprise p-methyl methacrylate or polystyrene and be formed by chemical vapor deposition or atomic layer epitaxy. Finally, the groove and liner are filled with a transparent polymer material having a relatively higher index of refraction. The filling material, which comprises the actual light-carrying waveguide structure, may comprise ULTEM polyetherimide or XU-218® polymer (available from Ciba-Geigy).

In one method for forming a structure in which light travels in a medium of higher index of refraction, a solid body of polymer material is formed in a groove which is lined with a solid material having a relatively lower index of refraction.

In accordance with another embodiment, which may be termed a "shrink back" embodiment, a polymer fiber optic waveguide is surrounded by a gap, which may be an air or other gas-filled gap, or even a vacuum. A method for forming such fiber optic waveguide begins by providing a substrate, such as a layer of polyimide, and forming a groove in the substrate surface, as by laser ablation. The groove is then filled with an uncured polymer material which shrinks upon curing, and which has an index of refraction greater than that of air. The uncured polymer material may comprise, for example, polyester resin or epoxy resin. Then the polymer material within the groove is allowed to cure and shrink to form a solid light-conducting structure smaller than the groove, such that a gap is formed between the solid light-conducting structure in the groove. Preferably, a cover layer is applied over the surface of the substrate to form a cover for the groove prior to allowing the polymer material within the groove to cure and shrink back, resulting in a gap between the solid light-conducting structure and the cover.

In accordance with yet another aspect of the invention, hollow light-conducting tubes (with or without metal liners) are formed by, for example, forming a groove in the surface of a body of polymer material and then applying a layer of reflective material to surfaces within the groove. A cover layer of polymer material including a reflective material surface layer facing the groove is applied over the surface of the body to form a cover for the groove. After the cover layer is applied, additional reflective material is preferably deposited on surfaces within the covered groove, as by chemical vapor deposition for example, to fill any voids in the layers of reflective material.

The groove in the surface may be formed in any of a variety of ways, such as: employing a laser to ablate the polymer material; depositing a metal mask layer on the surface, forming an opening in the metal mask layer to define the location of the groove, and selectively etching the groove; or hot tool pressing.

Alternatively, a groove is formed in the surface of a body of polymer material, such as by laser ablation, masking and selective etching, or hot tool pressing. A cover layer of polymer material is applied over the surface of the body to form a cover for the groove, and finally a layer of reflective material is formed on surfaces within the covered groove. Chemical vapor deposition may be employed to form a layer of reflective material on surfaces within the covered groove. The reflective material is preferably a layer of metal, such as aluminum or gold.

A number of structures may be fabricated in accordance with the invention, including a transmission structure comprising a hollow microtunnel in polymer material for conducting cooling fluid, and such hollow microtunnels with a light-reflective liner comprising an optical transmission structure. In hybrid hollow structures, both a metal current-conducting liner and a light conducting liner are included.

The techniques of the invention may also be employed to form an optical switch which includes a layer of polymer material having a channel with two ends formed therein, liquid crystal material within the channel, and a pair of electrodes for applying a voltage across the liquid crystal material to control light transmission between the channel ends.

BRIEF DESCRIPTION OF THE DRAWINGS

While the novel features of the invention are set forth with particularity in the appended claims, the invention, both as to organization and content, will be better understood and appreciated from the following detailed description taken in conjunction with the drawings, in which:

DETAILED DESCRIPTION

Figure 1:
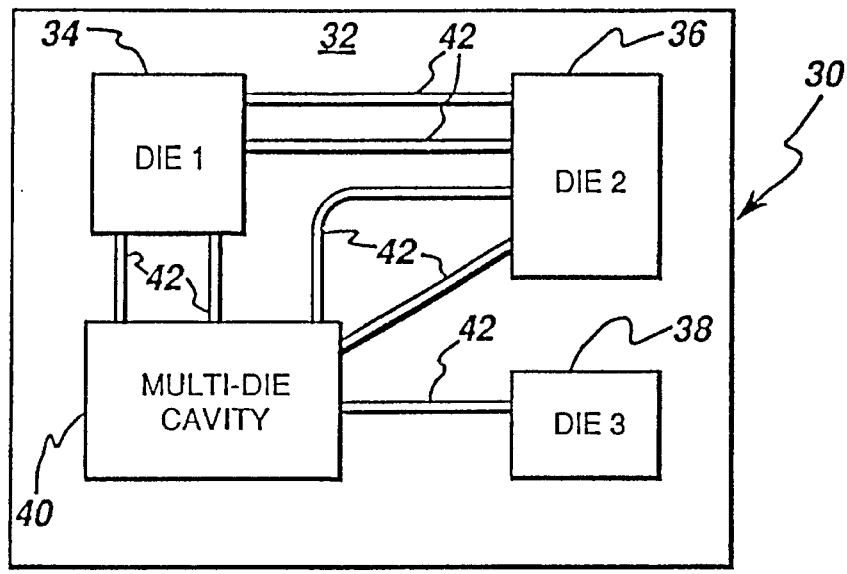
FIG. 1 is a conceptual overview of optical interconnects in HDI modules.

Referring initially to FIG. 1, the use of optical interconnects within an HDI-like module 30 is depicted in conceptual overview. Module 30 includes a substrate 32 upon which are mounted three representative dies 34, 36 and 38, which may comprise optical devices or electro-optical devices. Module 30 additionally includes a multi-die cavity 40, including a plurality of individual devices situated therein and which may comprise an assortment of electronic and electro-optical devices (not individually shown). Although not illustrated, module 30 additionally includes a high density interconnect (HDI) structure for making electrical interconnections between the various components, and supplying power thereto. HDI fabrication techniques are described in the background patents referred to hereinabove, and are described briefly below with reference to FIG. 12.

A particular feature of the FIG. 1 module 30 is the use of optical waveguides 42 interconnecting the various devices. It is a feature of the invention that the optical waveguides may be fabricated employing techniques compatible with well-developed HDI fabrication techniques, and may be adaptively positioned by adaptive lithography, such as disclosed in the above-identified Eichelberger et al. U.S. Pat. No. 4,835,704, in view of the actual positions of the individual devices.

Thus, as variations on known and well-developed HDI fabrication processes, channels and other structures are formed in polymer materials, using masking or direct laser ablation techniques. For example, a laser under program control may be employed to directly ablate a controlled depth pattern of channels and canals. Laser power and profile are used to vary the channel depth, in a manner known in the context of HDI fabrication techniques, such as the exemplary laser drilling techniques disclosed in the above-identified Eichelberger et al. U.S. Pat. Nos. 4,714,516 and 4,894,115, and Loughran et al. U.S. Pat. No. 4,764,485.

The resultant channel pattern resembles resist images normally used to pattern metal in the HDI fabrication process. These channels are cleaned by any convenient method, such as plasma ashing, reactive ion etching, or the like, to form a smooth profiled surface conducive to light propagation. In addition, the channels can be formed at least in part by other techniques, such as hot tool pressing.

There are a variety of materials which may be employed in the practice of the invention to fabricate optical waveguide structures, with index of refraction being a significant parameter to consider in any selection process. A number of such materials are identified in the following table:

TABLE

CANDIDATE MATERIALS FOR WAVEGUIDE APPLICATIONS

| Polymer | Index of Refraction |
| --- | --- |
| TEFLON ® AF-1600 (DuPont) | 1.29–1.31 |
| TEFLON PFA (DuPont) | 1.34 |
| PMMA | 1.49–1.56 |
| Epoxies | 1.5–1.6 |
| Polycarbonate (GE) | 1.573 |
| Parylene C (Novatran Corp.) | 1.639 |
| Parylene N | 1.661 |
| Parylene D | 1.669 |
| Polyetherimide (GE) | 1.641 |
| Polyimides: | |
| KAPTON (DuPont) | 1.66 |
| SPI-129 (MicroSi) | 1.732 |
| PI-2555 (DuPont) | 1.702 |
| SIXEF-44 (Hoescht) | 1.627 |
| XU-218 (Ciba-Geigy) | 1.614 |
| PI (Honeywell) | 1.62–1.65 |
| PROBIMIDE ® 400 (Ciba-Geigy) | 1.64 |

As is known, the general rule for total internal reflection, particularly in the context of fiber optic cables having a light-transmissive core surrounded by a cladding material, is that the material in which the light travels should have a higher index of refraction than the cladding material. As the angle of incidence increases, a critical angle is reached, for example 45°, where total internal reflection occurs. Air or vacuum as a cladding is ideal, since the index of refraction for both is almost 1.0.

Nevertheless, light may be transmitted where the material in which light is traveling has a lower index of refraction than the cladding material. In such situations, internal reflection becomes near total at angles of incidence approaching 90°, that is at near-grazing angles of incidence.

FIGS. 2–8 illustrate an adaptive process for making several types of optical connections, and the resultant structure. A negative imaging process is employed in the embodiment of FIGS. 2–8 to form a waveguide above a surface.

Figure 2:
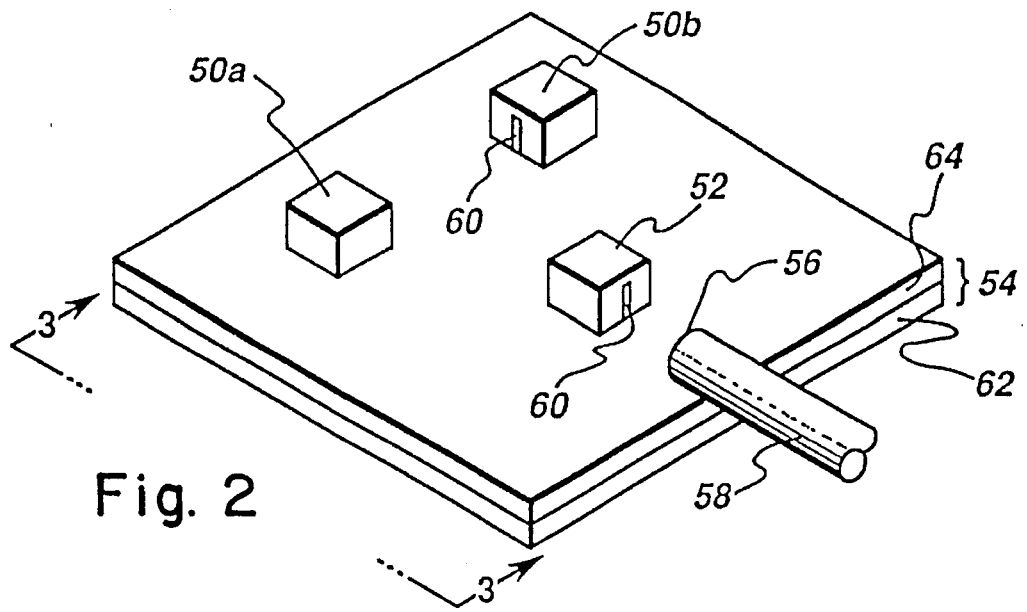
FIGS. 2–8 depict steps in an adaptive method for forming a lightguide rod structure on a substrate, and the resultant structure.
Figure 3:
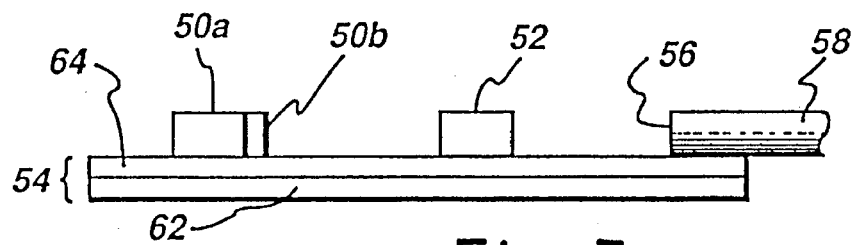

FIGS. 2 and 3 depict a conceptual starting point wherein a pair of electro-optical devices 50a and 50b and another electro-optical device 52 are mounted on a substrate 54, as is an end 56 of an external waveguide 58. The external waveguide may be a glass fiber optic waveguide, or may comprise a polymer material. Visible on electro-optical devices 50b and 52 are representative optical ports designated 60. Electro-optical devices 50a and 50b are, for purposes of example, to be optically coupled to each other, while electro-optical device 52 is, for purposes of example, to be optically coupled to waveguide 58. Thus one of the device pairs 50a, 50b is an optical source, such as a laser diode, and the other is an optical detector, such as a photodiode. Device 52 may be either an optical source or detector, depending upon the application.

Substrate 54 comprises two layers, a base layer 62, which may be made of any suitable material, such as a ceramic, and a layer 64 of suitable optical cladding material having a relatively lower index of refraction. Examples of optical cladding materials useful for layer 64 are p-methyl methacrylate (PMMA, index 1.49), polystyrene (index 1.58 to 1.66), tetrafluoroethylene (TFE, index 1.35), fluorinated ethylene propylene (FEP, index 1.338) and PFA TEFLON (index 1.338 to 1.340).

The electro-optical devices 50a, 50b and 52 are generally situated at respective predetermined positions and orientations on substrate 54. However, because commercially-available pick-and-place equipment used to position devices is subject to tolerance variations, devices 50a, 50b and 52 are not necessarily exactly at their ideal positions and orientations on the substrate 54.

The actual positions and orientations of devices 50a, 50b and 52 on substrate 54 are determined by employing, for example, optical imaging techniques, such as disclosed in Eichelberger et al. U.S. Pat. No. 4,835,704. The position of waveguide 82 may also be determined in this manner.

Figure 4:
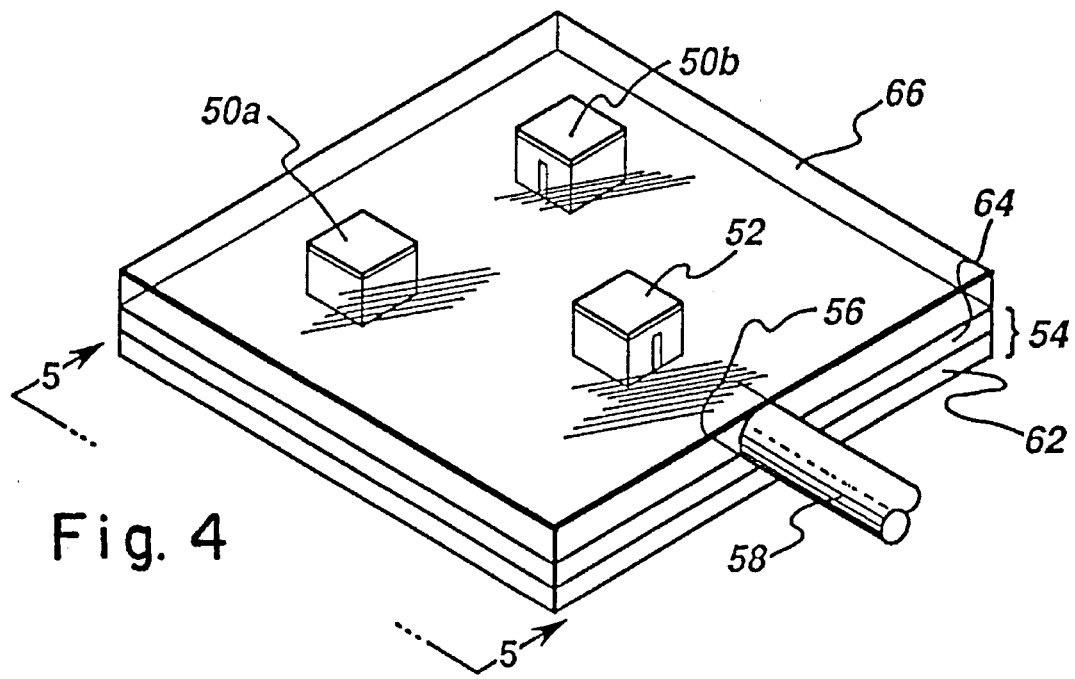
Figure 5:
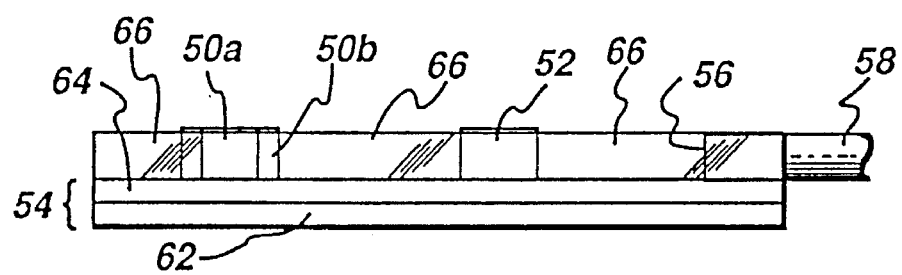

Next, and as depicted in FIGS. 4 and 5, devices 50a, 50b and 52, as well as the end 56 of external waveguide 58, are at least partially embedded in a layer of optical waveguide material 66 having a relatively higher index of refraction. The layer of optical waveguide material 66 may comprise, for example, ULTEM polyimide (index 1.66), XU-218 polyimide (index 1.614) or PROBIMIDE 400 polyimide (index 1.64). Layer 66 may be applied by any suitable process, such as by applying an uncured resin and allowing the resin to cure to form a single layer, by spin coating successive sublayers to build up the final thickness of layer 66, through solvent evaporation techniques, by pouring hot liquefied optical waveguide material and allowing it to cool and solidify, or by film lamination techniques.

Figure 6:
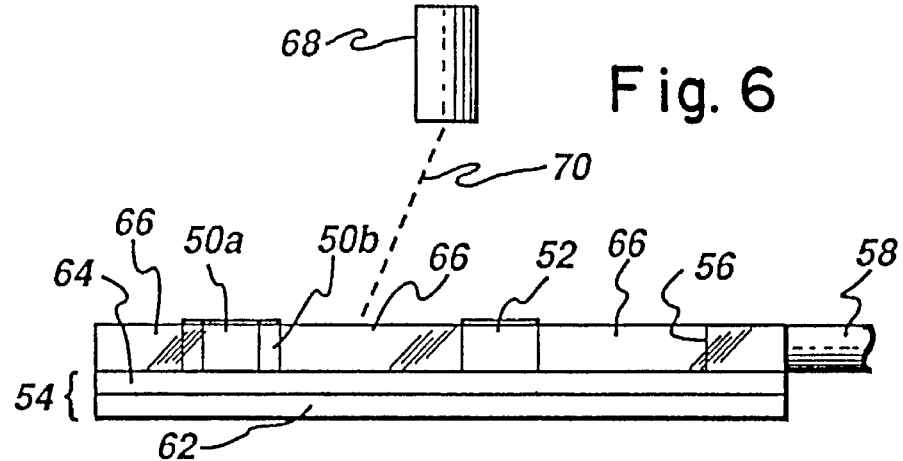
Figure 7:
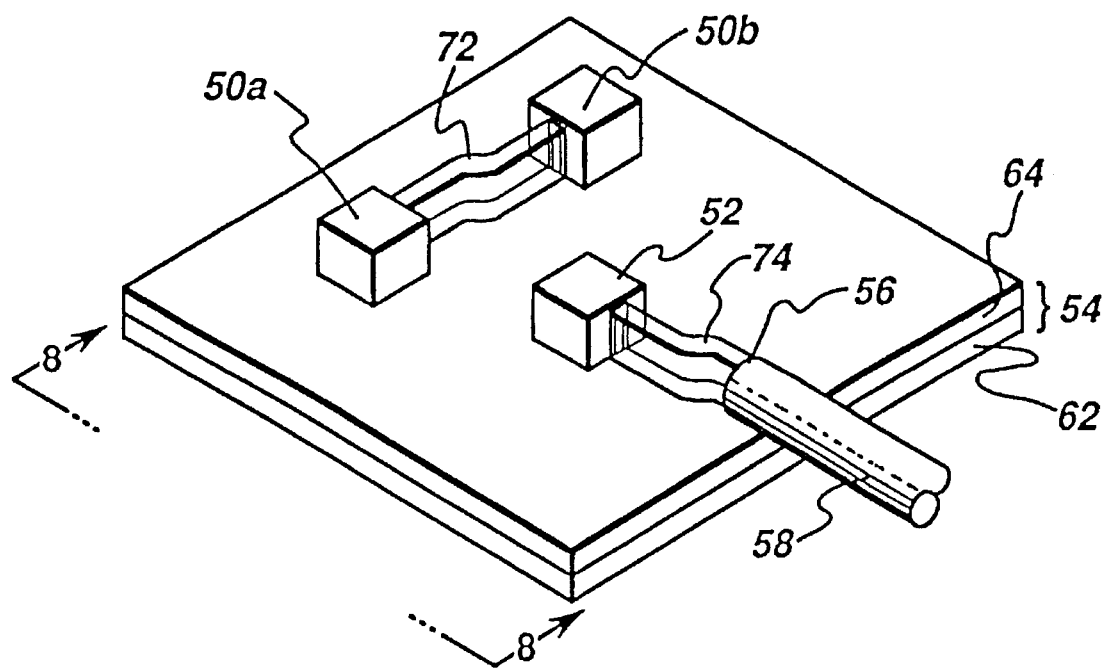
Figure 8:
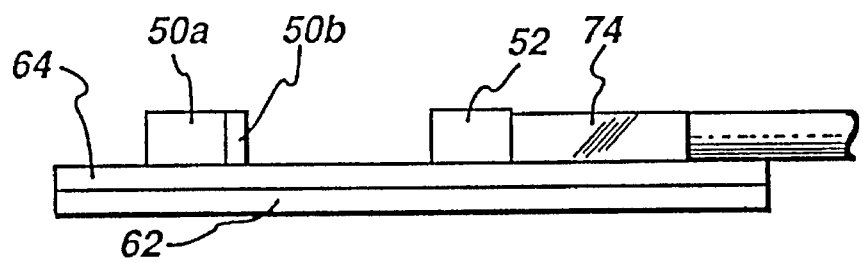

Next, as conceptually illustrated in FIG. 6, a programmable scanning laser, such as an argon ion laser with associated optics and scanning mechanism, generally designated 68, producing an energy beam 70, is employed to form waveguide structures 72 and 74 above the surface of substrate 54, as illustrated in FIGS. 7 and 8. In this example, a negative imaging technique is employed to ablate away material of layer 66 where no waveguide is to remain. The resultant waveguide 72 couples devices 50a and 50b, while the resultant waveguide 74 couples device 52 and external waveguide 58.

It is significant that the waveguide structures 72 and 74 in this example deviate from straight-line connections in order to accommodate the actual positions of devices 50a, 50b and 52, and thus are each formed along a route adapted as required for a proper optical connection to devices 50a, 50b and 52 in their actual positions and orientations.

Although not illustrated, it will be appreciated that the resultant structure of FIGS. 7 and 8 can be further processed by embedding the entire structure within a suitable waveguide cladding material having a relatively lower index of refraction. In absence of such cladding, air or other surrounding ambient media having a nominal index of refraction of 1.0 maintains the total internal reflection characteristics of waveguides 72 and 74.

Although a negative imaging technique is described above with reference to the embodiment of FIGS. 2-8, it will be appreciated that a positive imaging technique may equally well be employed, wherein a channel profile is formed below a surface. Representative resultant structures are described below with reference to FIGS. 15, 16A, 16B, 17A and 17B, but at this point it may be noted that the negative imaging process as just described can be modified to implement positive imaging, beginning with the step illustrated by FIGS. 4 and 5, by embedding devices 50a, 50b and 52 in a layer of cladding material rather than a layer of waveguide material. The programmable scanning laser 58 of FIG. 6 is then employed to adaptively form channels in layer 66, and the channels are then filled with a suitable light-conductive waveguide material. During such process, the optical ports 60 of devices 50a, 50b and 52 are protected from the action of the programmable scanning laser 60 beam 70 by masking with a photoresist, or other UV resistant material such as a polyimide, polyester, acrylate or epoxy, used as a resist.

Figure 9:
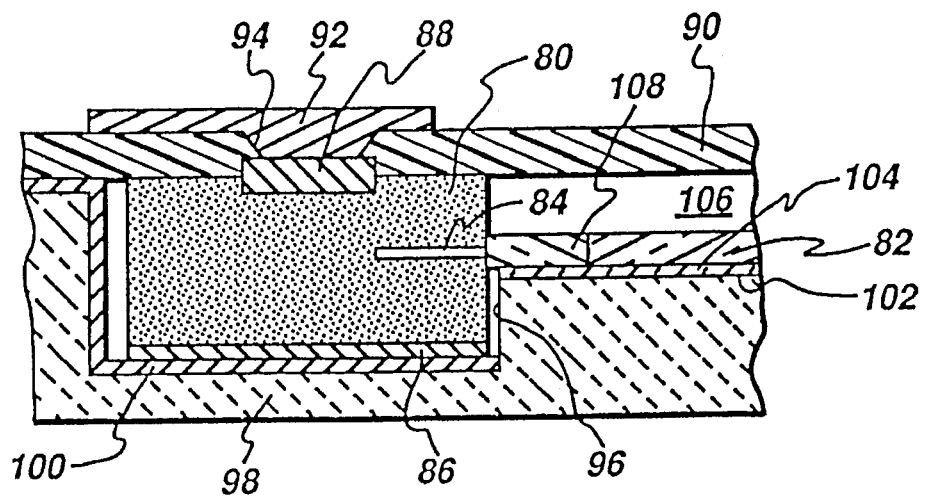
FIG. 9 is a sectional side view depicting a laser diode adaptively connected to an optical fiber.
Figure 10:
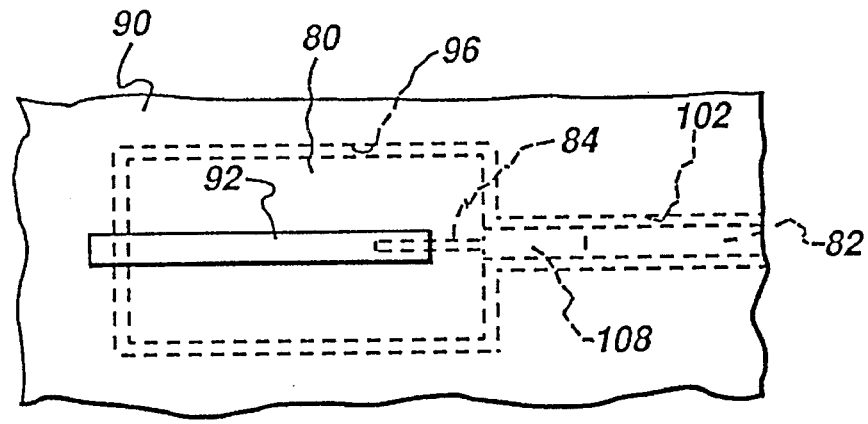
FIG. 10 is a top view of the adaptively connected laser diode of FIG. 9.

FIGS. 9 and 10 depict a variation of the structure of FIGS. 7 and 8, wherein an optical semiconductor or electro-optical device, in this example a laser diode 80, is adaptively interconnected to an external optical fiber or optical waveguide 82. Examples of other electro-optical devices which may be similarly connected are multiplexers, decoders, senders and receivers. As has been discussed above, it is difficult, without adaptation, to properly align with a waveguide or optical fiber 82 an electro-optical device such as laser diode 80, due to potential misposition of both the diode and the waveguide.

Laser diode 80 more particularly comprises a generally elliptical exit slit 84 which emits a beam on the order of one or two micrometers in width. Laser diode includes a cathode electrode 86 and an anode electrode 88.

Laser diode 80 is generally included in an HDI structure such as described in the background patents enumerated above, which HDI structure includes a KAPTON dielectric layer 90, and a metallized conductor 92 electrically contacting the diode anode pad 88 through an adaptively-positioned via 94. Laser diode 80 is received within a cavity 96 formed in a ceramic substrate 98, and the bottom of cavity 96 supports a conductive metal layer 100 extending up to the surface of substrate 98 to facilitate electrical connection to cathode electrode 86. Similarly, a fiber well or channel 102 (FIG. 10) is formed in the substrate, generally aligned with exit aperture 84. Preferably, and if required to maintain total internal reflection, a layer 104 of cladding material is provided within channel 102, generally comparable to cladding material layer 64 described in conjunction with FIGS. 2-8.

Depending on the relative sizes of device 80 and waveguide 82, as well as the positioning of exit aperture 84, there may be a space 106 between waveguide 82 and the subsequently-laminated dielectric layer 90. Space 106 may be an air space, or may be filled with a waveguide cladding material (not shown) having a suitable index of refraction. In order to maintain air space 106, air or other gas under pressure may be injected at an appropriate stage of the lamination process. Exemplary lamination techniques are disclosed in Eichelberger et al. Pat. No. 4,933,042.

Connection between the external waveguide 82 and the exit slit 84 is provided by an optical waveguide segment 108 adaptively formed, as described above, along a route adapted as required for a proper optical connection between device 80 and waveguide 82.

In an alternative method of fabricating a structure similar to that of FIGS. 9 and 10, optical fiber 82 is inserted into well or channel 102. Laser diode 80, preferably with optical waveguide segment 108 already attached, is placed within cavity 96. Adaptive lithography may be employed to align exit slit 84 and waveguide segment 108 prior to placing laser diode 80 within the cavity. Waveguide segment 108 is then heated by a laser or a hot gas reflow mechanism so that the waveguide segment bonds with optical fiber 82, as well as with laser diode 80 if not already bonded.

Figure 11:
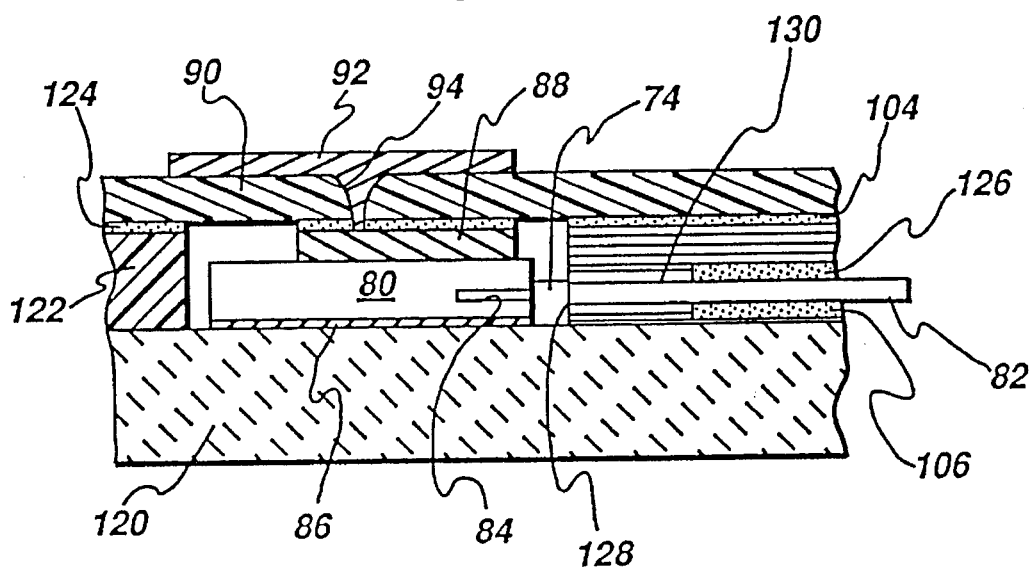
FIG. 11 is a sectional side view of an alternative connection to a laser diode.

FIG. 11 depicts another technique for interfacing a cladded optical fiber 82 to laser diode 80. In FIG. 11, laser diode 80 is embodied in what is generally the previously-known HDI structure comprising a ceramic substrate 120, a KAPTON polyimide layer 122 used as a spacing layer, and KAPTON polyimide dielectric layer 90 supporting metallization 92 and adhered to KAPTON polyimide spacing layer 122 by an ULTEM polyetherimide adhesive layer 124. Optical fiber 82 is secured in position within the structure by means of a suitable bonding adhesive 126, and is supported near its end 128 by layers 130 of polyimide.

The actual connection between laser diode exit aperture 84 and optical fiber 82 constitutes an adaptively formed waveguide segment 74, generally comprised of polymer material.

Figure 12:
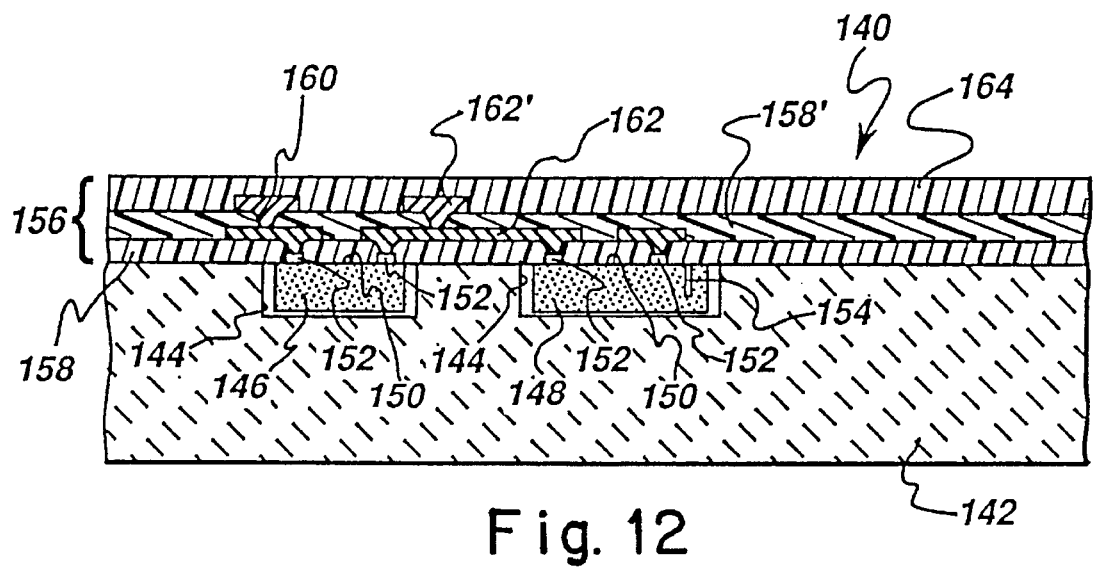
FIGS. 12–14 are sectional side views depicting an adaptive method for integrating an electro-optical device within an HDI structure, and the resultant structure.
Figure 13:
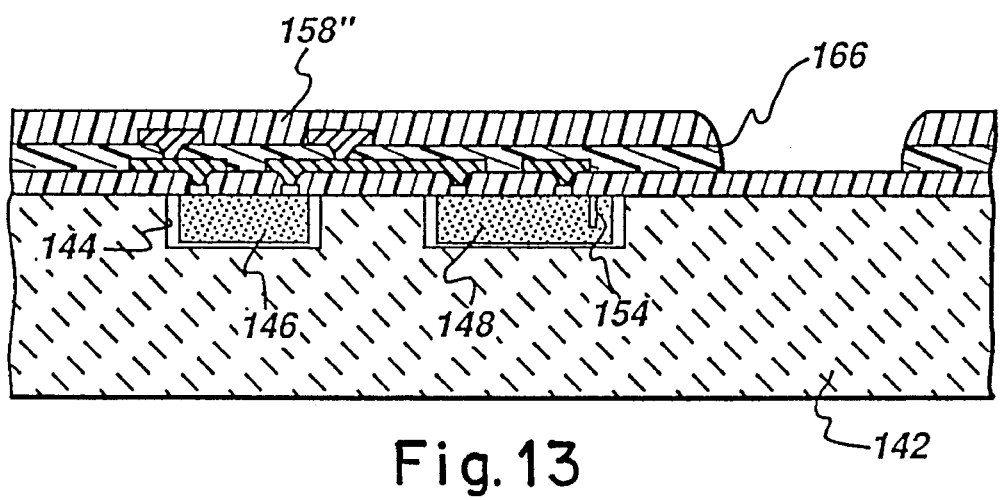
Figure 14:
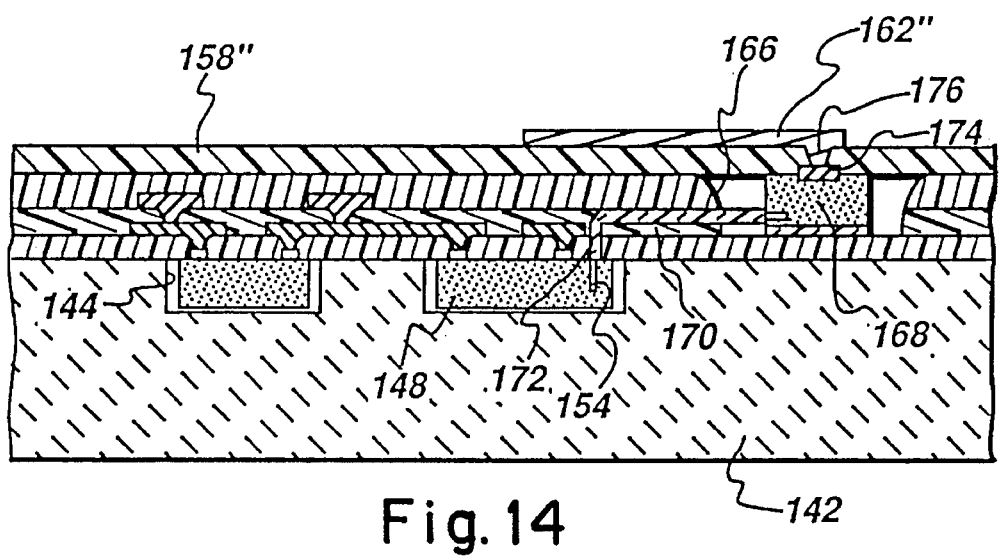

FIGS. 12–14 depict a variation on the adaptive method of forming a lightguide rod structure shown in FIGS. 2–8, wherein an electro-optical device is integrated within a high density interconnect module after the high density interconnect module is initially formed.

AS a starting point, FIG. 12 depicts a high density interconnect module 140 of the type generally described above in the background section, and includes a ceramic substrate 142 having representative cavities 144 formed therein by a suitable milling process, such as laser, ultrasonic or mechanical milling. Placed and adhered within cavities 144 are components in the representative form of individual integrated circuit chips 146 and 148 having upper surfaces 150 with chip contact pads 152 disposed thereon. In this example, chip 148 is an electro-optical device, and includes an optical port 154 on its major surface.

HDI module 140 is completed by fabricating an interconnect structure in the form of an overcoat 156. Briefly, a polyimide film 158, such as KAPTON polyimide about 12.5 to 75 microns thick, is pre-treated to promote adhesion, and is coated on one side with a polyetherimide resin or another thermoplastic (not shown). Film 158 is then laminated across the upper surfaces 150 of chips 146 and 148, and across the upper unmilled surface of substrate 142, through its coated side. Thereafter, via holes 160 are laser drilled in KAPTON polyimide film 158 (and the coated thermoplastic layer thereon) in alignment with contact pads 152 on chips 146 and 148 to which it is desired to make contact. Buildup of HDI overcoat 156 continues by forming a patterned metallization layer 162 over KAPTON polyimide layer 158, extending into via holes 160 to make electrical contact with chip contact pads 152. Additional dielectric and metallization layers are provided as required (such as layers 158' and 162') in order to provide all of the desired electrical connections among chips 146 and 148. HDI overcoat 156 may include a protective upper polymer layer 164.

As shown in FIG. 13, a portion of multilayer interconnect structure 156 is then removed, to form a cavity opening 166 therein, the cavity bottom comprising layer 158 of KAPTON polyimide. The cavity opening may be formed by any one of several processes, such as laser ablation, mask and RIE etch, mechanical milling or selective etching.

Next, as depicted in FIG. 14, an electro-optical device 168 is placed within cavity opening 166. Although electro-optical device 168 has a nominal position and orientation, it is not necessarily in a predetermined ideal position and orientation, and the actual position and orientation are accordingly determined by adoptive lithography as set forth in the aforementioned U.S. Pat. No. 4,783,695.

Subsequent processing proceeds generally as described above with reference to FIGS. 2–8, to adaptively form an optical waveguide 170 connected to device 168. In this particular example, optical waveguide 170 is connected to optical port 154 of device 148 through an appropriate optical via 172.

To provide electrical connection to device 168, a further dielectric layer 158" is applied, so long as conditions for total internal reflection within the various waveguide structures are maintained. Layer 158" has patterned metallization layer 162" contacting a contact pad 174 through a via 176.

Figure 15:
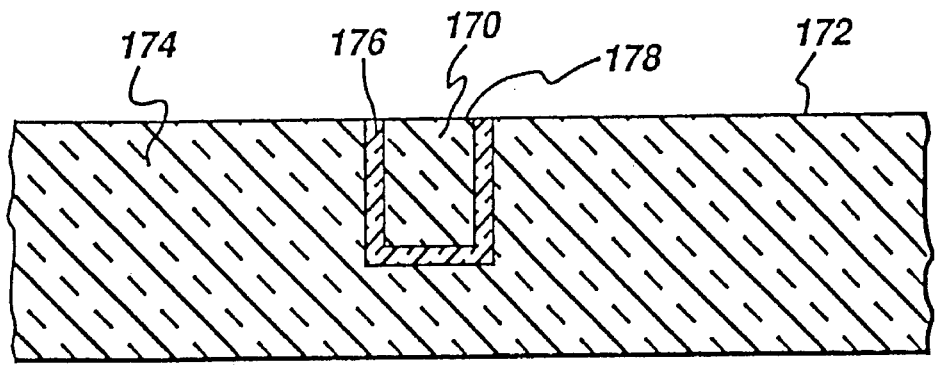
FIG. 15 is a cross-sectional view of a optical waveguide structure formed within a liner of relatively lower index of refraction.

FIG. 15 depicts in greater detail a cross section of an optical waveguide structure formed by positive imaging techniques wherein a waveguide medium 170, such as a polyimide, is below the surface 172 of a substrate 174, also of polyimide. In order to confine light by total internal reflection within waveguide 170, the waveguide is formed within a liner 176 of a material having a relatively lower index of refraction, such as p-methyl methacrylate or polystyrene. The upper surface 178 of optical waveguide 170 is exposed to air or other gaseous media having a nominal index of refraction of 1.0, thus maintaining total internal reflection at the upper surface.

Figure 16A:
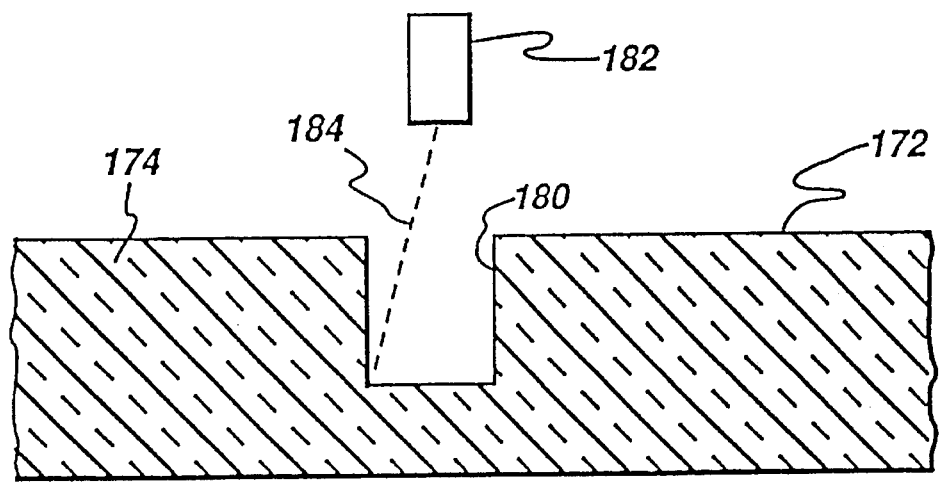
FIGS. 16A and 16B depict method steps in fabricating the structure of FIG. 15.

A process for making the structure of FIG. 15 includes the step, illustrated in FIG. 16A, of forming a groove or channel 180 in the surface 172 of polymer substrate material 174. As described hereinabove with reference to FIG. 6, an argon ion laser assembly 182 emitting a controlled beam 184 is employed to adaptively form channel 180 in a desired position. In order to form a smooth profiled surface conducive to light propagation, channel 180 is cleaned by any convenient method such as plasma ashing, reactive ion etching, or the like.

Figure 16B:
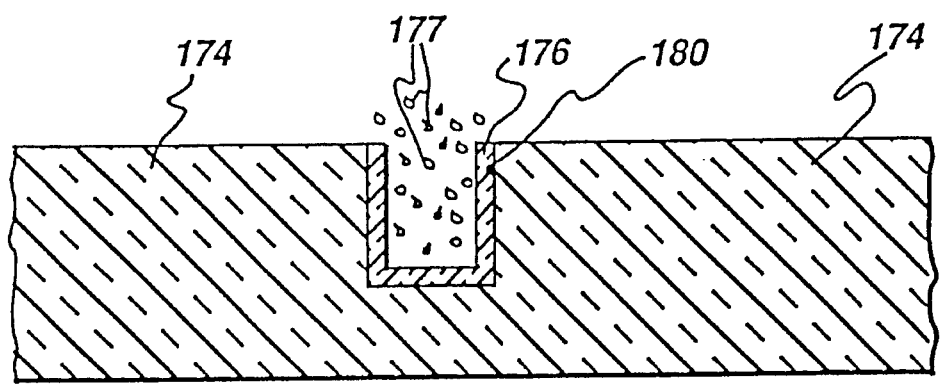

Next, as depicted in FIG. 16B, liner 176 of the material having a relatively lower index of refraction is formed within groove 180 through a suitable process such as chemical vapor deposition or atomic layer epitaxy, indicated by particles 177. Thereafter, groove 180 and liner 176 are filled with a transparent polymer material having a relatively higher index of refraction in order to form the resultant structure of FIG. 15.

Figure 17A:
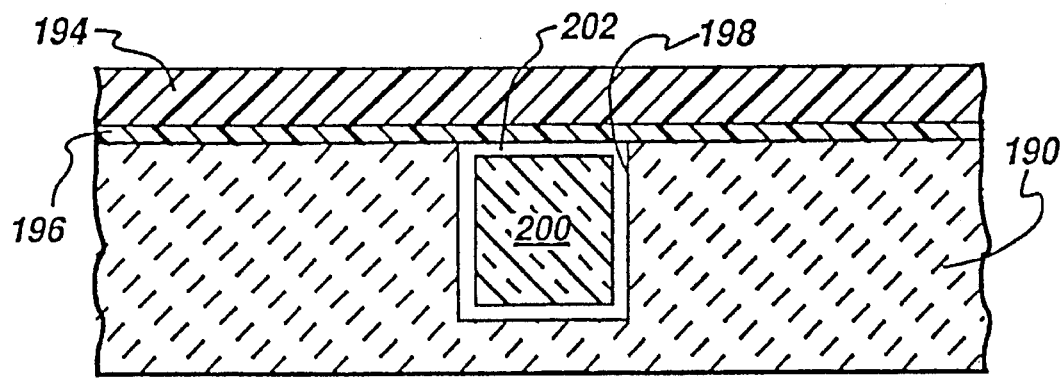
FIG. 17A is a cross-sectional view of a shrink back solid light pipe surrounded by an air gap within a groove in a ceramic substrate.
Figure 17B:
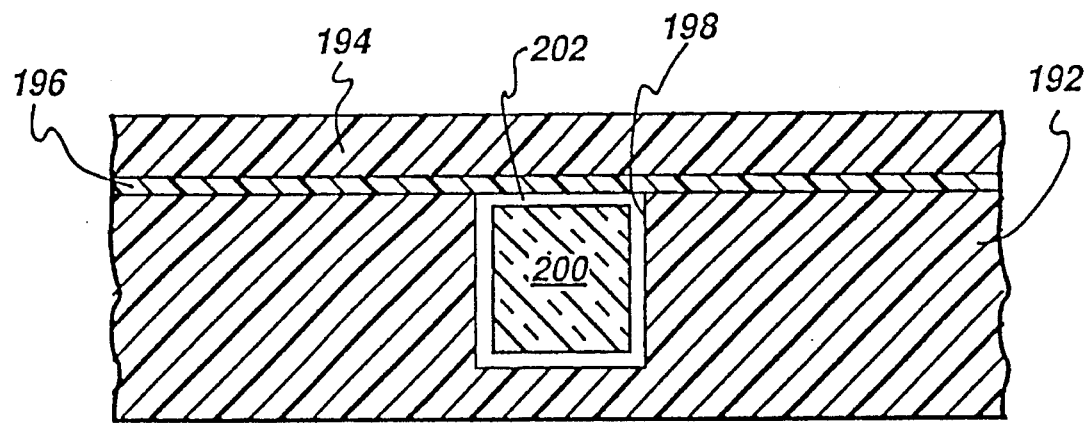
FIG. 17B is cross-sectional view similar to that of FIG. 17A, but wherein the groove is in a polymer body.

As an alternative to the low refractive index liner 176 of FIG. 15, FIGS. 17A and 17B illustrate alternative forms of a "shrink-back" embodiment wherein an optically transmissive light pipe is generally surrounded by an air gap, or other gaseous gap, rather than by a solid material. FIGS. 17A and 17B differ from each other primarily in the substrate employed; i.e., substrate 190 of FIG. 17A is ceramic, whereas substrate 192 in FIG. 17B is a polymer material, such as KAPTON polyimide. In both cases, a polymer cover comprising a KAPTON polyimide layer 194 and an ULTEM polyetherimide adhesive layer 196 is formed over a channel 198 in substrate 190 or 192. Between substrate 190 or 192 and a polymer waveguide 200 is an air gap 202 which separates the waveguide material from the wall of channel 198. This yields an air gap 202 having an index of refraction of very nearly 1.0, with waveguide 200 being formed of a shrink-away material of a selectable index of refraction.

Light-conductive waveguide 200 touches cavity walls 198 at various points along its length, potentially resulting in some light loss at those points. However, the total area of such contact points relative to the overall surface area of waveguide 200 is relatively insignificant, and the resultant loss can be tolerated.

In methods of forming structures such as shown in FIGS. 17A or 17B, groove 198 is formed in substrate 190 or 192, using a process appropriate to the particular substrate material, such as laser ablation or milling. After cover 194 is applied, the resultant tunnel-like structure is filled with an uncured polymer material which shrinks upon curing and which has an index of refraction greater than that of air, to form waveguide 200. Examples of suitable polymer materials are epoxies, polyesters and acrylates. The polymer material within the groove or tunnel is accordingly allowed to cure and shrink to form the solid light-conducting structure smaller than the groove, resulting in the gap. The degree of shrink back may be controlled through appropriate selection of the particular materials used.

Preferably a release agent (not shown) is employed to facilitate release of shrink-back waveguide material 200 from the walls of the groove or tunnel. Exemplary release agents, which are employed to coat the tunnel walls prior to filling with uncured polymer material, are silicones and TEFLON polytetrafluoroethylene. (Teflon is a trademark of E.I. dupont de Nemours & Company.)

The channels or tunnels can be filled after assembly of an electro-optical module. Tunnels can be pressure injected by employing micro-piping, syringe injection, or the like. Vacuum is preferably employed to eliminate bubbles. The tunnels may be filled throughout a module, from level to level, forming vertical vias, integral splitters and the like.

Figure 18:
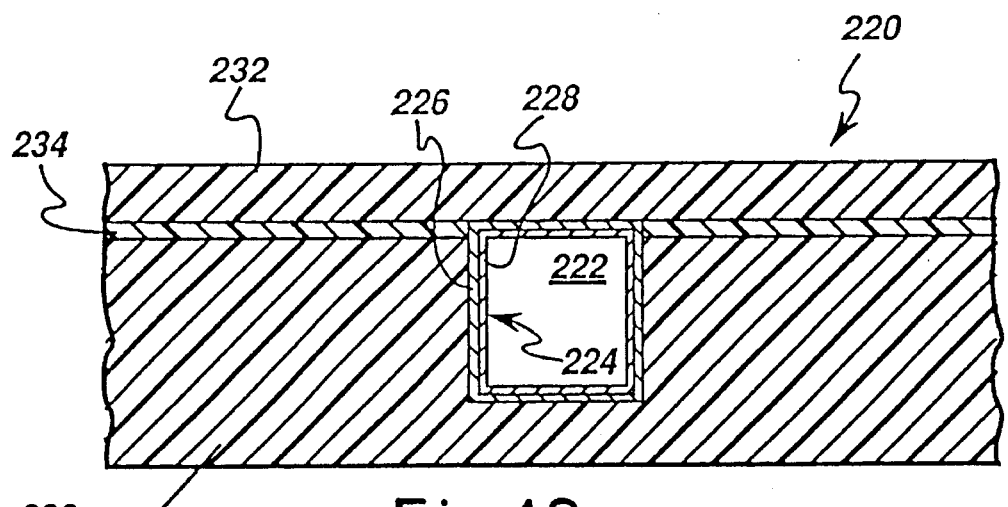
FIG. 18 is a cross-sectional view of a hollow metallized tube embodiment.

The embodiments described in detail up to this point have involved solid optical waveguide structures. FIG. 18 illustrates in cross section a hollow waveguide-like structure 220 comprising a hollow microchannel or tunnel 222 lined with a reflective surface material 224, preferably metal, such as gold, aluminum or silver. The lining or walls thus formed typically comprise two sub-layers 226 and 228. As in the previous embodiments, the structure is formed within a polyimide substrate 230 and a polyimide cover layer 232 is attached by means of a suitable adhesive layer 234. The tunnel-like structure is thus surface-coated with metals such as gold, aluminum or silver, or appropriate dielectric coatings of high reflectivity, to transmit light flux through tunnel 222 by reflection without total internal reflection. The cross-sectional dimensions of tunnel 222 are on the order of several mils by several mils, with lengths ranging from several mils to several inches.

The hollow tube structure shown in FIG. 18 has two advantages in particular. As one advantage, the tunnel structures may be employed to carry fluid, either gaseous or liquid, for cooling electronic modules. (In the case of a liquid cooling fluid, optical transmission by means of reflection would normally not be employed.) In fact, the tunnels of the invention may be employed for cooling purposes alone, not necessarily in combination with the transmission of optical signals.

As a second advantage, because walls 224 may be comprised of metal, electrical signals may be carried by the same channels. Thus, for example, power and ground currents may be carried through metal walls 224, and the metal walls may as well comprise signal conductors.

Related to this, the waveguide structures thus formed may be employed for transmitting high frequency electrical energy or signals, such as microwaves.

FIGS. 19A through 19D depict one process for fabricating a hollow waveguide structure such as that shown in FIG. 18.

Figure 19A:
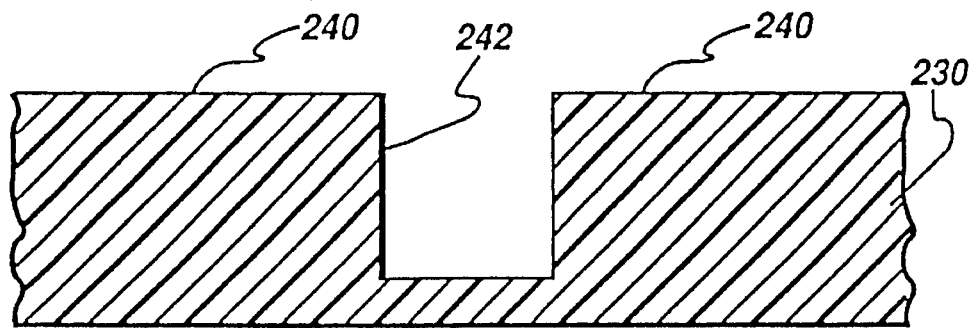
FIGS. 19A through 19D depict method steps for fabricating the structure of FIG. 18 wherein grooves are formed by laser ablation.

In FIG. 19A, an argon ion laser (not shown) operating at 351 nm wavelength is used to ablate a channel 242 in the surface 240 of a body of polymer material 230, forming a micro-channel typically a few mils wide and a few mils deep. Channel 242 is further cleaned after ablation using appropriate plasma ashing or reactive ion etching processes.

Figure 19B:
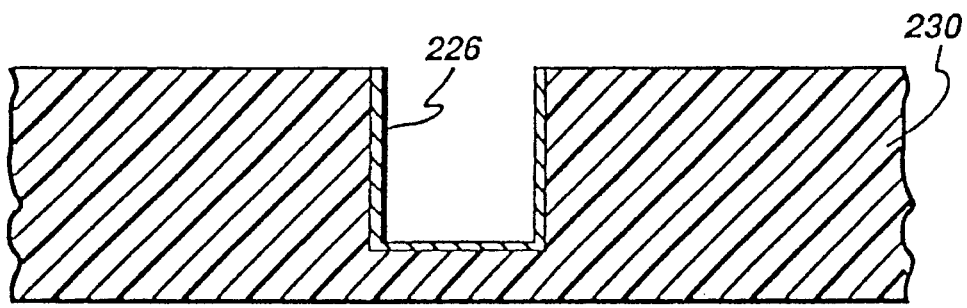

Next, with reference to FIG. 19B, layer 226 of reflective material is applied to surfaces of the groove. Layer 226 may comprise titanium, gold, or other appropriate metal, including sublayers (not shown) for the desired light transfer. Metal layer 226 is deposited by any suitable process such as vapor deposition or sputtering, and is patterned selectively in channel 242 either by photolithographic techniques, or by mechanically lapping the entire top surface leaving metal only in the channels.

Figure 19C:
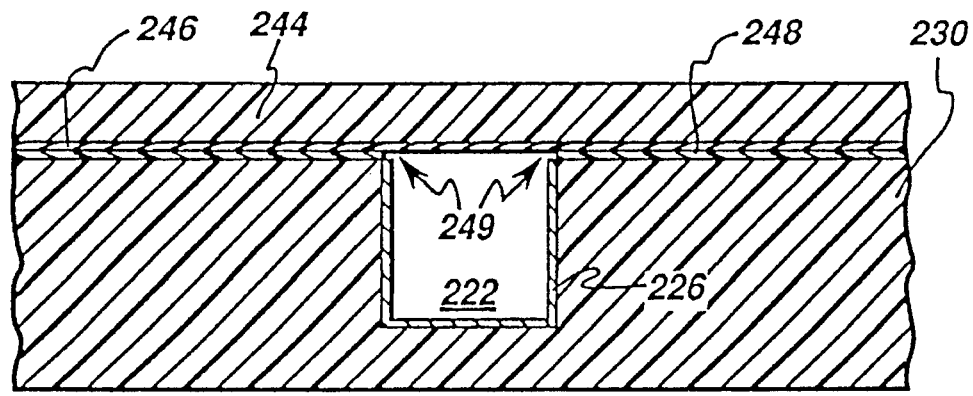
Figure 19D:
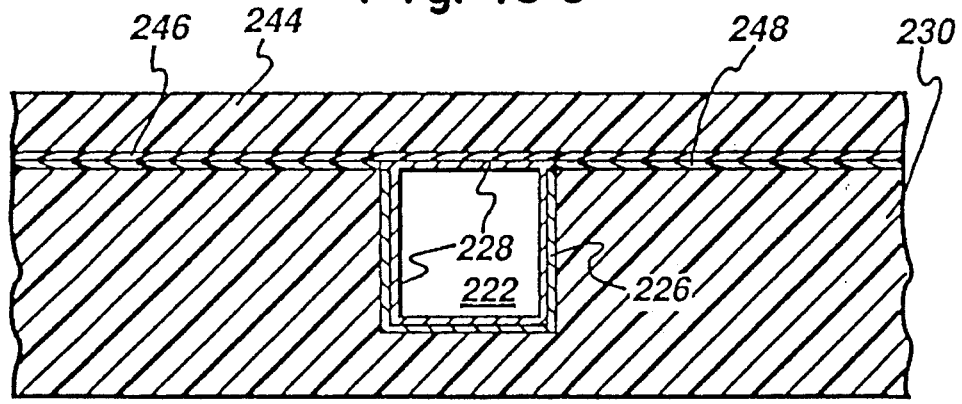

As an initially separate element, a layer of KAPTON polyimide 244 is also metallized, for example with Ti/Au, and then laminated over the surface 240 of polymer body 230, as depicted in FIG. 19C. The lamination is carried out with the metallized strip 246 face down, i.e., contacting polymer 230, through a layer 248 of ULTEM polyetherimide adhesive.

This process as thus far described may result in voids 249 on the surface metallization within tunnel or microchannel 222. Accordingly, to produce the structure of FIG. 19D with substantially continuous metallization, an additional layer 228 of gold, for example, is formed. This may be accomplished by purging an organometallic gold compound such as gold hexafluoroacetylacetonate, which has a vapor pressure of approximately 0.7 torr at room temperature, through tunnels 222, and heating the solid compound above its decomposition point. Gold is thus deposited on the inner surfaces of the channels, and other volatile byproducts are purged out of the tunnels. Subsequent purging by air or other gas, or a liquid, may be done to clean the channels after the purging with the organometallic compound. This approach provides a way of metallizing the entire inner surfaces of the tunnels or microchannels. Laser or other heating from above can be used to locally heat-assist decomposition of the gold compound, and pressure may be introduced to prevent the tunnels from collapsing.

Rather than pre-metallizing KAPTON polyimide cover layer 244 with metallized strip 246 as shown in FIG. 19C, chemical vapor deposition may be employed as the only means for depositing gold on the interior surfaces of the tunnel. Such as process is represented in FIGS. 20A through 20E, which also depict an alternative method for forming the groove.

Figure 20A:
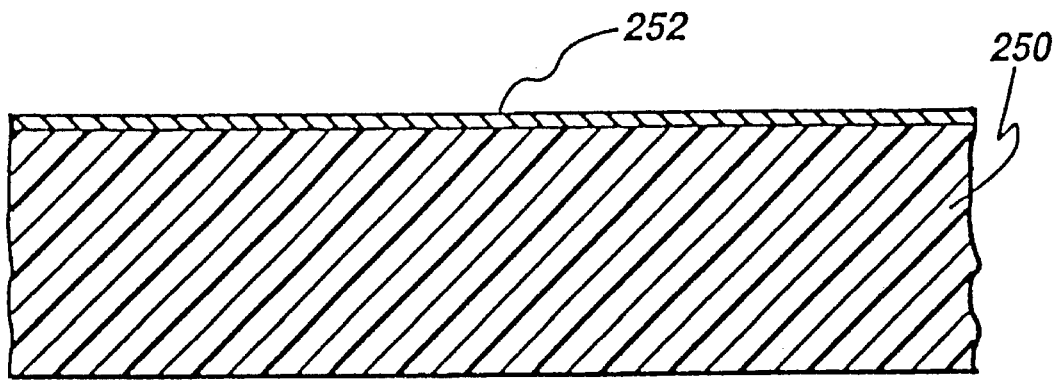
FIGS. 20A through 20E depict alternative steps for fabricating a hollow metallized waveguide such as that of FIG. 18, wherein grooves are formed by masking.
Figure 20B:
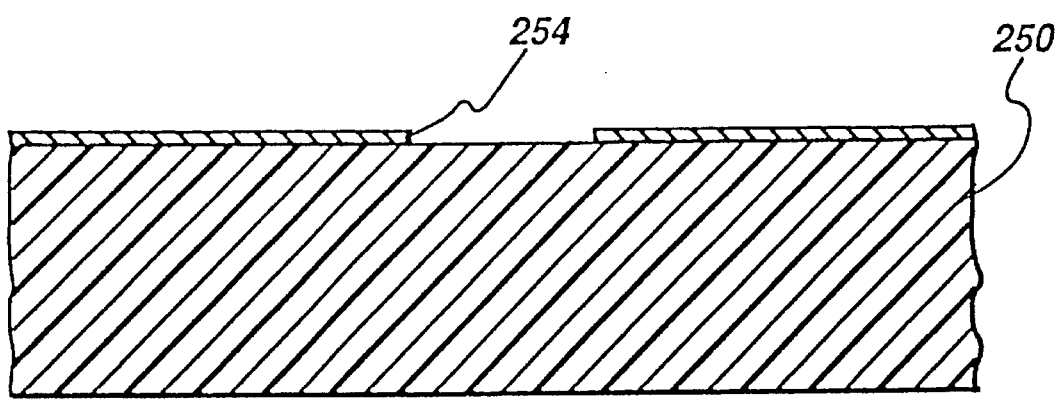

Thus, as shown in FIG. 20A, a metal mask 252 is deposited on the surface of a polymer substrate 250 which may comprise KAPTON polyimide. An opening 254 is then formed in metal mask 252, as shown in FIG. 20B, which opening 254 defines the location of the subsequently-formed groove. Metal mask 252 may comprise sputtered titanium. A photoresist (not shown) is coated on the titanium layer, and patterned using an argon ion laser to form opening 254 in the mask.

Figure 20C:
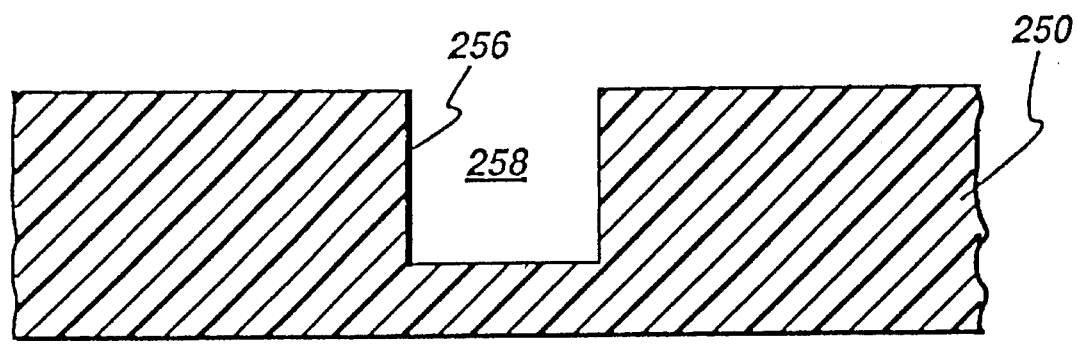

The structure is then placed in a reactive ion etching chamber, and channels are etched in unprotected regions of substrate 250, producing a channel 256 such as shown in FIG. 20C. Mask layer 254 is also removed.

Figure 20D:
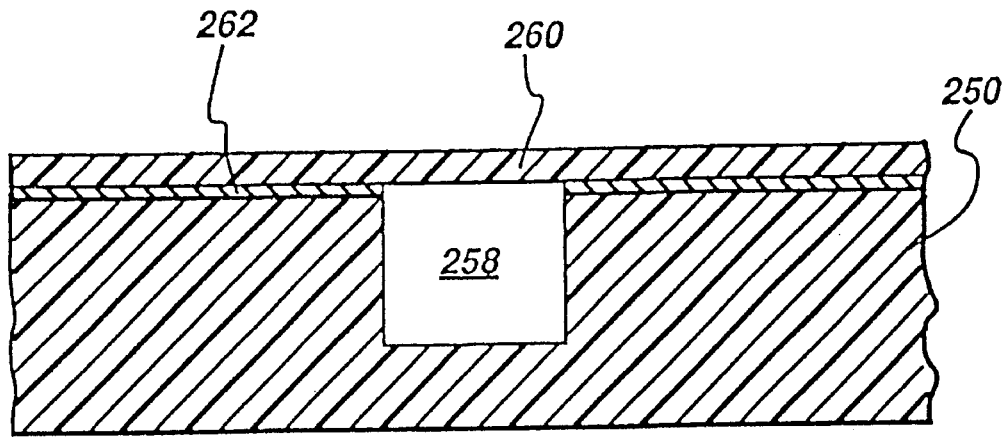
Figure 20E:
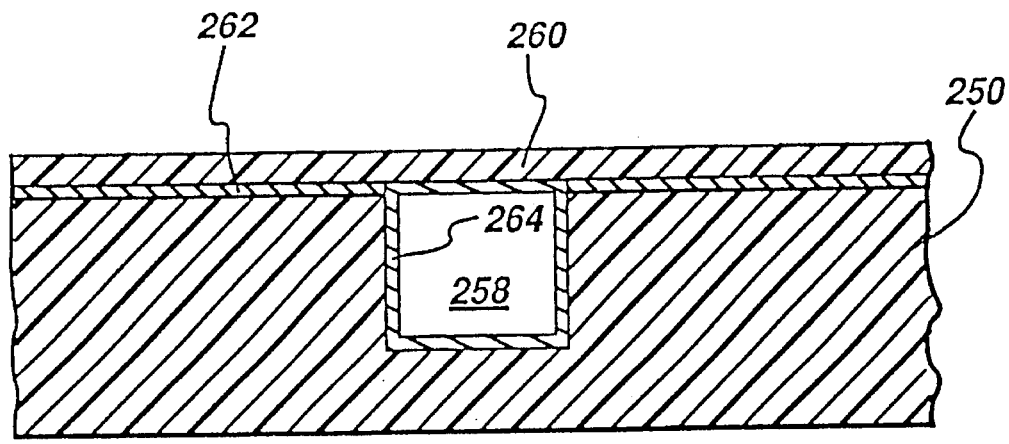

As illustrated in FIG. 20D, a second layer 260 of KAPTON polyimide is laminated over channel 258, again employing an ULTEM polyetherimide adhesive layer 262. Thereafter, as shown in FIG. 20E, chemical vapor deposition is employed to form a gold lining 264 inside tunnel 258.

As alternatives to gold, various organic and inorganic flow-through coatings can be used to produce the desired reflective optional tube. Silver nitrate solutions can be coated onto a polymer surface, or micro doped into the polymer directly, and then later laser-heated, hot gassed inside the tubes, or E-beam bombarded to form mirror reflecting surfaces.

Figure 21:
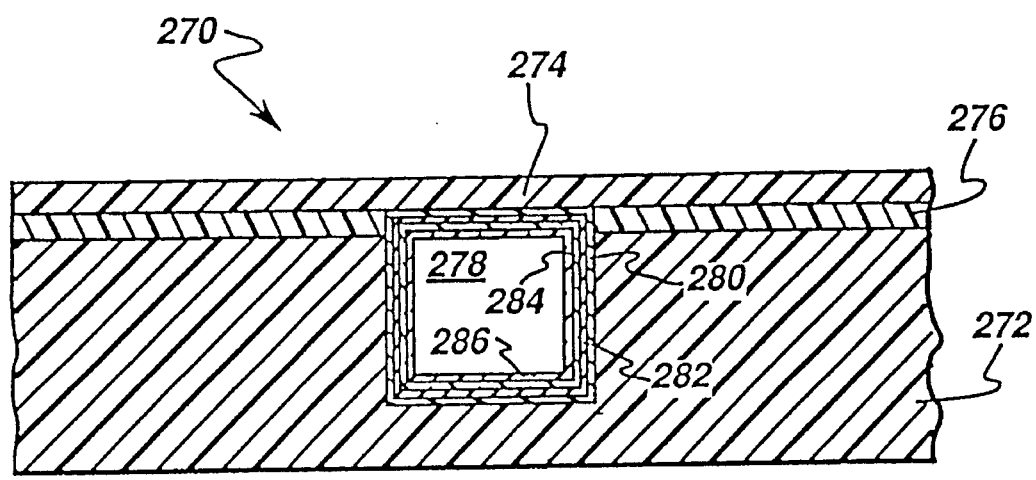
FIG. 21 is a cross-sectional view of a hybrid structure comprising both metal and optical signal-carrying walls surrounding a hollow core.

FIG. 21 illustrates a hybrid structure 270 which may be fabricated in accordance with the techniques of the invention. Structure 270 may be generally characterized as a metallized tunnel with an optical liner for light transmission and center cooling. Thus, structure 270 includes a laser-channeled polymer substrate 272 with a top cover 274 of Kapton polyimide laminated by means of a layer of Ultem adhesive 276.

A hollow tunnel 278 includes two metallized lining layers 280 and 282, generally as described above with reference to FIGS. 19A through 19D, for example. Sublayer 280 may comprise titanium and layer 282 may comprise copper, for example.

Formed over layer 282 is an optical signal-conducting layer 284, including cladding, comprising a polymer material having a relatively high index of refraction, formed by a process such as chemical vapor deposition (CVD) or atomic layer epitaxy (ALE).

Finally, particularly in cases where center liquid cooling is employed, there is an interior layer 286 of waveguide cladding material, also formed by a process such as ALE, CVD, or spin-on or spray-on coating.

In structure 270 of FIG. 21, electrical signal currents or power supply connections may be carried through metal layers 280 and 282, while optical signals are carried through the sleeve-like optical waveguide material 284. The hollow center 278 of waveguide structure 270 is then available for cooling.

The order of the layers can be reversed, or further layers can be employed. For example, layer 284 may comprise waveguide cladding material and layer 286 may comprise waveguide optical transmissive material, particularly where a gaseous fluid (having an index of refraction of approximately 1.0) is employed for center cooling.

Figure 22A:
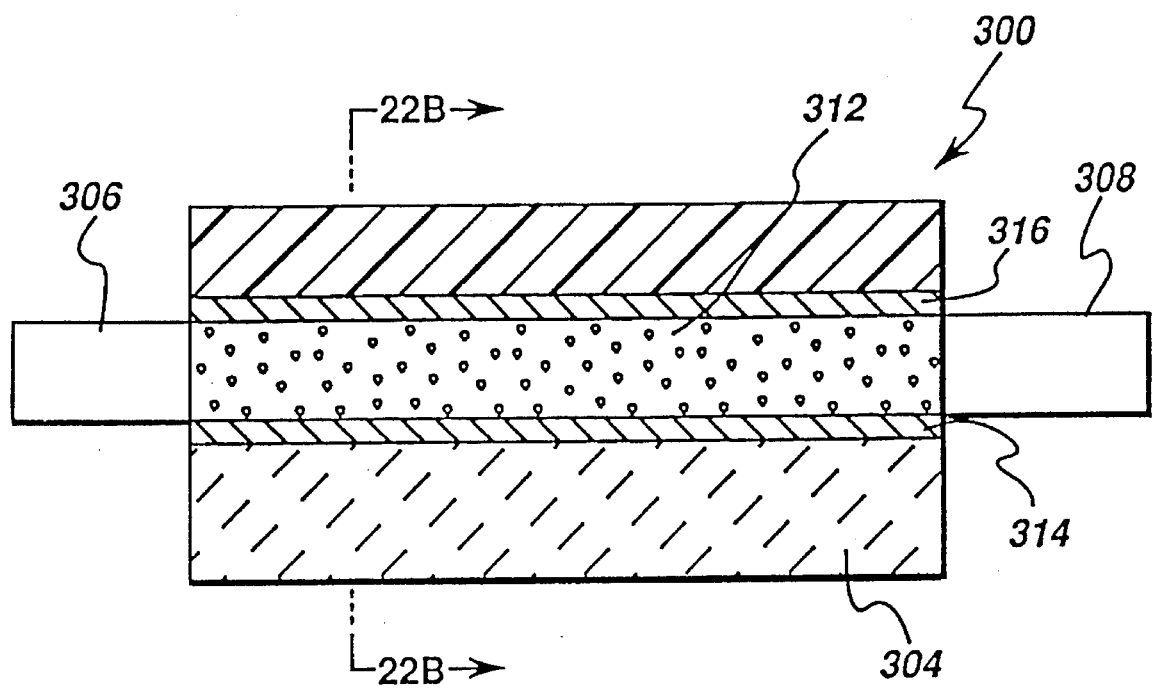
FIG. 22A depicts a liquid crystal switch in longitudinal cross section.
Figure 22B:
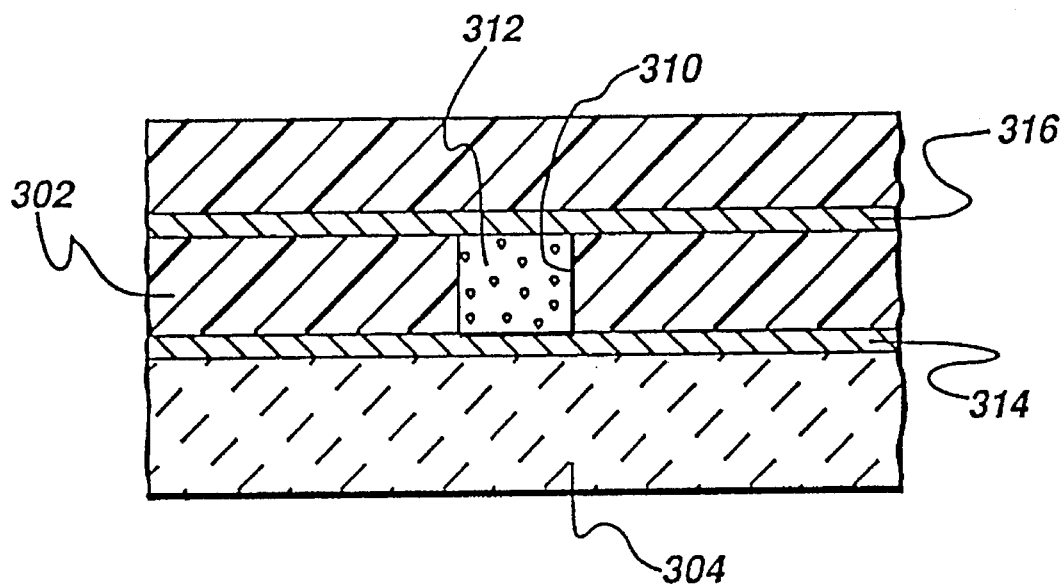
FIG. 22B depicts the liquid crystal switch of FIG. 22A in lateral cross section.

FIGS. 22A and 22B, represent in longitudinal and lateral cross section, respectively, a microtube liquid crystal switch 300. In general, liquid crystal switch 300 resembles an optical waveguide of the type employing a solid light transmission medium but, instead of a material which is always transmissive to light, a liquid crystal solution is employed which, through application of external electric fields, may in effect become alternatively transmissive, non-transmissive, or partially transmissive, for example through changes in index of refraction.

To form liquid crystal switch 300, a layer 302 of KAPTON polyimide is laminated to an HDI interconnect structure, represented only as a substrate 304, using a low temperature thermoplastic adhesive (not shown). The lamination is carried out at 150° C. using a polyester adhesive (such as T-320 available from Sheldahl Corporation, Northfield, Minn.). Large portions of this layer are ablated away, so as to create wells, using an argon ion laser. Electro-optical devices, represented in FIG. 22A as optical source 306 and optical detector 308, are then bonded in these wells, and electrically connected to an HDI circuit.

A microchannel 310 is then formed as described hereinabove. However, rather than employing a solid light transmissive material, a liquid crystal material 312 between two electrodes 314 and 316 is employed. The total length of the liquid crystal switch is kept relatively small, on the order of a few millimeters, and fast switching times are provided by utilizing a polymer-dispersed liquid crystal electro-optic effect. When a voltage is applied through electrodes 314 and 316 across layer 312, the orientation of the liquid crystal molecules is changed, resulting in a change in refractive index which blocks light from entering the optical detector. Relatively fast switching times are possible because the effective liquid crystal thickness is extremely small. Response times of significantly less than a millisecond are possible.

While specific embodiments of the invention have been illustrated and described herein, it is realized that numerous modifications and changes will occur to those skilled in the art. It is therefore to be understood that the appended claims are intended to cover all such modifications and changes as fall within a true spirit and scope of the invention.

What is claimed is:

1. A method for forming a fiber optic light guide, comprising the steps of:

providing a first electro-optic component having a first light port, and a second electro-optic component having a second light port;

providing a body of a first polymer material, having a surface;

mounting each of the first and second components in the first polymer body, near a predetermined ideal position and orientation;

finding an actual location and orientation of each of the first and second light ports, between which ports the light guide is to be formed;

adaptively forming a groove in the body of the first polymer material through the surface thereof and between a first port site, determined by the first actual location and orientation, and a second port site, determined by the second actual location and orientation;

forming a liner, within the adaptively-formed groove in said first polymer material, of a liner material having a relatively low index of refraction; and filling the groove and liner, between the first and second port sites, with a transparent second polymer material having a relatively high index of refraction.

2. The method in accordance with claim 1, wherein the step of forming a liner comprises chemical vapor depositing the relatively low index of refraction liner material.

3. The method in accordance with claim 1, wherein the step of forming a liner comprises atomic layer epitaxy deposition of the relatively low index of refraction liner material.

4. The method in accordance with claim 1, wherein the step of forming a groove in the surface of the first polymer material body comprises laser-ablating the first polymer material.

5. The method in accordance with claim 1, wherein the first polymer material body comprises a layer of a polyimide.

6. The method in accordance with claim 1, wherein the liner material comprises a polymer material selected from the group consisting of p-methyl methacrylate and polystyrene.

7. The method in accordance with claim 6, wherein the step of filling the groove and liner comprises filling the groove and liner with a second polymer material selected from the group consisting of:

polyetherimide and polyimide.

8. A method for forming a fiber optic light guide, comprising the steps of:

providing a first electro-optic component having a first light port, and a second electro-optic component having a second light port;

providing a substrate having a surface;

mounting each of the first and second components on the substrate, near a predetermined ideal position and orientation;

finding an actual location and orientation of each of the first and second light ports, between which ports the light guide is to be formed;

adaptively forming a groove into the substrate through the surface thereof and between a first port site, determined by the first actual location and orientation, and a second port site, determined by the second actual location and orientation;

filling the groove with an uncured polymer material which shrinks upon curing and has an index of refraction greater than that of air; and allowing the polymer material within the groove to cure and to shrink to form a solid light-conducting structure smaller than the groove so as to form a gap between the solid light-conducting structure and the groove.

9. The method in accordance with claim 8, which further comprises the steps of: applying a cover layer over the surface of the substrate to form a cover for the groove; and then allowing the polymer material within the groove to shrink upon curing, to form an additional gap situated between the solid light-conducting structure and the cover.

10. The method in accordance with claim 8, wherein the substrate comprises a polyimide material.

11. The method in accordance with claim 8, wherein the uncured polymer material comprises a material selected from the group consisting of polyester resin and epoxy resin.

12. The method in accordance with claim 10, wherein the step of forming a groove in the surface comprises laser-ablating the polyimide material.

* * * * *